United States Patent
Krahn et al.

(10) Patent No.: US 6,448,758 B1
(45) Date of Patent: Sep. 10, 2002

(54) METHOD FOR DETERMINING WEAR AND OTHER CHARACTERISTICS OF ELECTRODES IN HIGH VOLTAGE EQUIPMENT

(75) Inventors: John Raymond Krahn; Gerald Burt Kliman, both of Niskayuna, NY (US)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 09/479,595

(22) Filed: Jan. 7, 2000

(51) Int. Cl.[7] .............................................. G01R 31/02

(52) U.S. Cl. .................................................... 324/158.1

(58) Field of Search ........................ 324/556, 416–424, 324/661–663, 644, 158.1, 73.1, 415, 658, 544; 702/56

(56) References Cited

U.S. PATENT DOCUMENTS 6,008,661 A  * 12/1999  Goodwin .................... 324/662

\* cited by examiner

Primary Examiner—Vinh P. Nguyen
(74) Attorney, Agent, or Firm—Robert P. Santandrea; Noreen C. Johnson

(57) ABSTRACT

A diagnostic method for determining a characteristic of electrode contacts and/or contacted surfaces comprising the steps of: sensing, during a movement that causes an electrode to have a break contact event with a first contacted surface and to have a make contact event with a second contacted surface, an RF signal from at least one electrical discharge event during that movement; and using a parameter of the RF signal to diagnose the characteristic of the electrode contacts and/or contacted surfaces. In a preferred embodiment of the present invention, a step may be included of sensing, simultaneously with the RF signal sensing step, a vibration signal generated by at least one of the break contact event and the make contact event; and using a parameter of the vibration signal to assist in diagnosing the characteristic of the electrode contacts.

33 Claims, 9 Drawing Sheets

NEW CONTACT

NORMAL CONTACT WEAR

END OF CONTACT LIFE

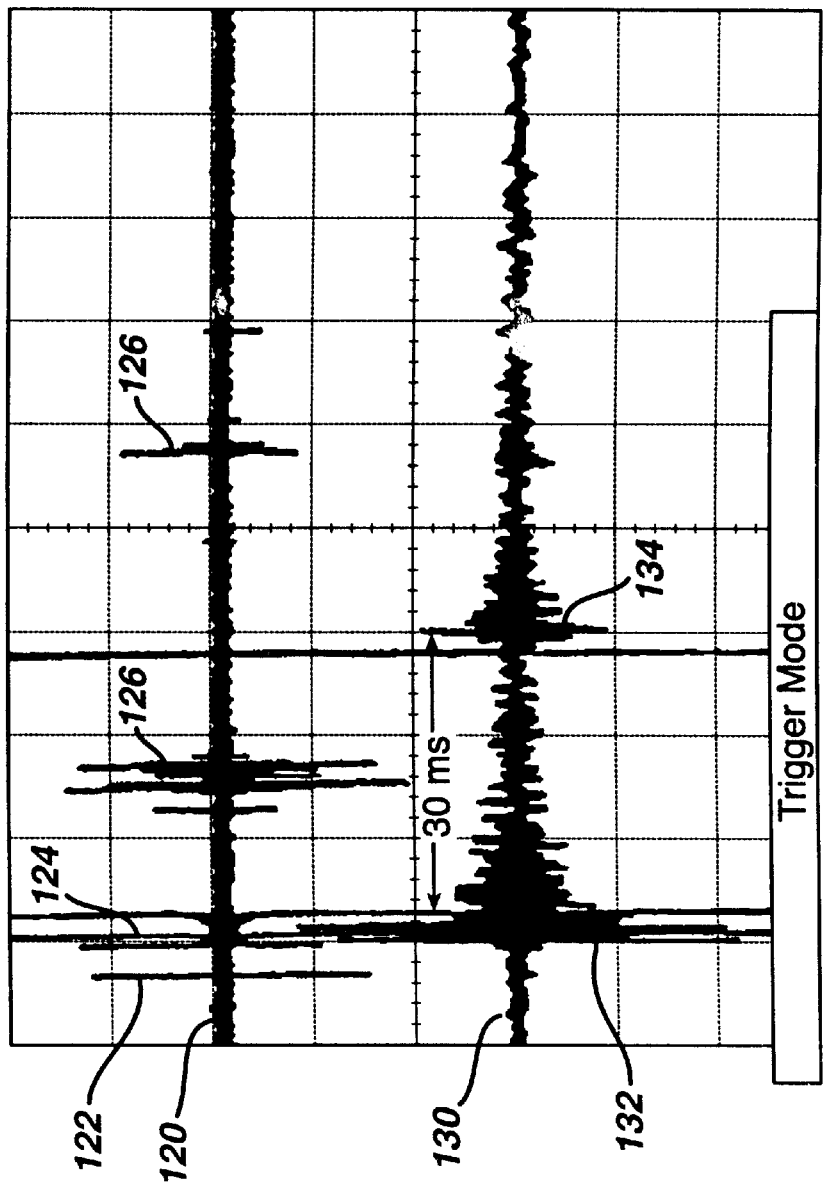

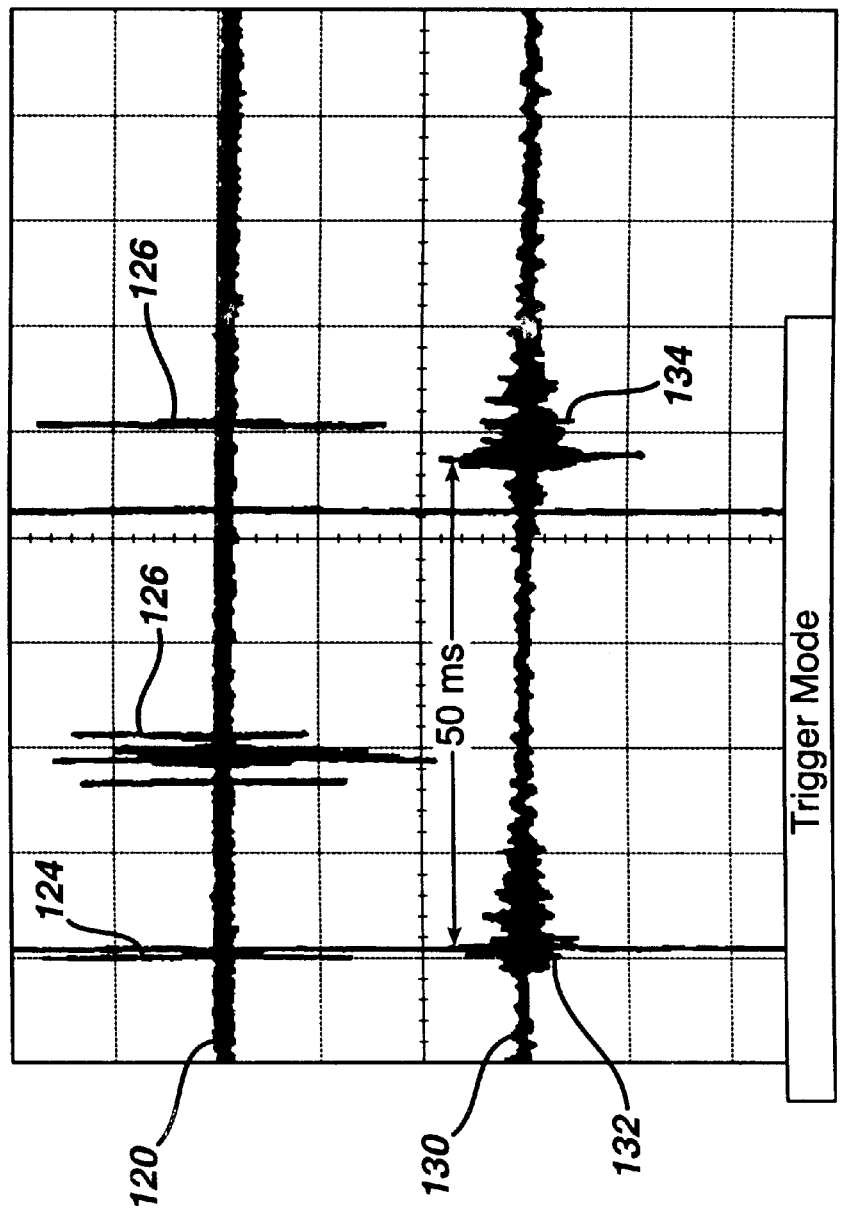

METHOD FOR DETERMINING WEAR AND OTHER CHARACTERISTICS OF ELECTRODES IN HIGH VOLTAGE EQUIPMENT

BACKGROUND OF THE INVENTION

1. Field of the Invention

The present invention relates generally to the field of voltage regulators and other high voltage equipment, and more particularly, to a method and structure for diagnosing the wear characteristic and other important characteristics of electrodes within voltage regulator/high voltage equipment.

2. Description of the Related Art

A power line voltage regulator is an electrical device which acts to effect changes in the voltage in an electrical power distribution system in response to changes in electrical load upon the power distribution system. Typically, these voltage regulators switch power at levels of approximately several hundred amperes and over ten thousand volts. The adjustment or change in the voltage is by means of a mechanism that mechanically changes the voltage by moving between a series of electrode taps (hence it is called a "load tap changer", or LTC). Typically, the electrode changing mechanism will comprise a plurality of shelves which are connected into different portions of a transformer winding, so that a connection to each of the different shelves will yield a different voltage from the transformer. A tap-change electrode will be disposed on an arm and will be moved mechanically among the various shelves to a shelf with the desired voltage. In a preferred embodiment, the shelves will be disposed in a circular configuration, with an arm rotating about the center of the circle of shelves, with the arm containing at the end thereof a tap-change electrode.

Tap-changes are typically made in a voltage regulator about fifteen times per day. The tap-change electrode contacts and contacting surface (the shelf) wear out over time and need replacement. Presently, scheduled maintenance replacement of the electrodes and the shelves are made at regular intervals or after a certain number of electrode changes have been logged by a counter actuated by a micro-switch. However, not all transformers or their taps are used equally, nor are transformers always equally loaded. Hence, all LTC contacts do not age at the same rate. Differences in alignment of the shelves and other manufacturing variations may also contribute to premature degradation of the taps or of the shelves. Accordingly, a maintenance schedule based on time elapsed, or based on the number of electrode changes may result in unnecessary equipment changes or unexpected failures. Furthermore, errors are often introduced during maintenance, which results in subsequent down time. Eliminating unnecessary maintenance and performing necessary maintenance only where required will save significant resources and money.

SUMMARY OF THE INVENTION

In one embodiment, the present invention comprises a diagnostic method for determining a characteristic of electrode contacts and/or contacted surfaces including the steps of: sensing, during a movement that causes an electrode to have a break contact event with a first contacted surface and to have a make contact event with a second contacted surface, an RF signal from at least one electrical discharge event during said movement; using a parameter of the RF signal to diagnose the characteristic of the electrode contacts and/or contacted surfaces.

In a further aspect of the present invention, the using step comprises the step of determining RF activity using the break contact and make contact events and determining a delay between the break contact event and the make contact event. The using step may further comprise comparing the determined delay with a reference delay.

In a further aspect of the present invention, the using step may comprise the step of determining an amplitude of the RF signal during at least one of the break contact event and the make contact event.

In yet a further aspect of the present invention, the delay determining step may comprise the step of counting clock pulses occurring between the break contact event and the make contact event.

In yet a further aspect of the present invention, the using step may comprise the step of integrating a portion of the RF signal.

In a further aspect of the present invention, the step may be included of sensing, simultaneously with the RF signal sensing step, a vibration signal generated by at least one of the break contact event and the make contact event; and using a parameter of the vibration signal to assist in diagnosing the characteristic.

In a further aspect of the present invention, the vibration signal parameter using step may comprise the step of digitally sampling the vibration signal.

In a yet further aspect of the present invention, the parameter using steps may comprise the steps of: determining a first time when a level of activity in the vibration signal exceeds a predetermined threshold level of activity; and monitoring a parameter of the RF signal in a time period that includes the first time.

In a yet further aspect of the present invention, the parameter using steps may comprise the steps of: determining a first time and a second time when a level of activity in the vibration signal exceeds a predetermined level of activity; and monitoring a parameter of the RF signal in a time period that includes the first and second times.

In a further aspect of the present invention, the activity in said vibration signal may comprise a vibration signal amplitude.

In yet a further aspect of the present invention, the activity in said vibration signal may comprise a peak grouping above a predetermined threshold.

In a further aspect of the invention, the activity in the vibration signal may comprise an integrated signal magnitude in a predetermined time interval.

In yet a further aspect of the present invention the RF signal monitoring step may comprise the step of either monitoring the amplitude of the RF signal, or the peak groupings of the RF signal, or the integrated signal magnitude in a predetermined time interval.

In yet a further aspect of the present invention, the step is included of sending the RF signal and the vibration signal to a computing device; determining a first time and a second time when a level of activity in the vibration signal exceeds a predetermined level of activity; and measuring parameters in each of the RF signal and the vibration signal that occur during a time period that includes the first and second times; and determining the characteristic based on at least one of the measured parameters.

In a further aspect of the present invention, the using step may comprise the step of recording waveforms representing aspects of the RF signal and the simultaneously sensed vibration signal in time synchronization. By way of example, these signals could be displayed together for visual inspection.

In a further aspect of the invention, a method is provided for determining a characteristic of electrode contacts and/or contacted surfaces in a voltage regulator comprising the steps of: sensing a vibration signal from said voltage regulator; sensing simultaneously an RF signal from the voltage regulator; determining at least a first time when a level of activity in the vibration signal exceeds a predetermined threshold level of activity; measuring a first parameter of the RF signal occurring in a time period that includes the first time; measuring a second parameter of the vibration signal occurring in the time period; and determining the characteristic based on at least one of the first and second parameters.

In a further aspect of the present invention, the first parameter of the RF signal is measured substantially only around the first and second times.

In a further aspect of the present invention, the at least one of the first and second parameters is a delay measurement between the first and second times; and wherein the delay measurement parameter is compared to a reference value.

In a further embodiment of the present invention, a diagnostic system is provided for determining a characteristic of electrode contacts and/or contacted surfaces, comprising: an RF sensor for sensing RF from partial electrical discharge events; a vibration sensor for sensing vibration from movement that causes an electrode to have a break contact event or a make contact event; circuit for determining a first time and a second time when a level of activity in the vibration signal exceeds a predetermined threshold level of activity; and a recorder for recording the RF signal and the vibration signal occurring in a time period that includes the first time and the second time.

In a yet further aspect of the invention, a circuit is included for determining a parameter of one of the RF signal and the vibration signal and comparing that parameter to a predetermined threshold.

BRIEF DESCRIPTION OF THE DRAWINGS

FIG. 4A is a graph of an RF signal and a simultaneously sensed vibration signal for a tap change event with new electrodes and new shelf surfaces under high voltage and no load.

FIG. 4B is graphical representation of an RF signal with a simultaneously sensed vibration signal for a tap change event with bad electrode contact and bad shelves under high voltage and no load.

DETAILED DESCRIPTION OF THE PREFERRED EMBODIMENT

A diagnostic method and structure have been discovered wherein the RF signal from discharge events can be correlated with an electrode contact moving off a shelf and onto a second shelf. It has further been discovered that this RF signal changes as the characteristics of the electrode and the shelves change over time due to wear and other problems.

In a further important aspect of the present invention, it has been discovered that it is particularly advantageous to measure RF (radio frequency) signals and to simultaneously measure vibration signals from the voltage regulator to thereby obtain a correlation between these two signals. The timing for break contact events and make contact events between taps and shelves can be determined accurately by monitoring a vibration signal, and then using the time for these contact events to monitor selected portions of the RF signal that occur around that time or times.

A yet further aspect of the present invention encompasses the digital sampling of these signals to thereby allow the detection, extraction and storage in a database of a variety of signatures representing particular characteristics of the electrodes and/or shelves for comparison to previously measured signatures.

Figure 1:
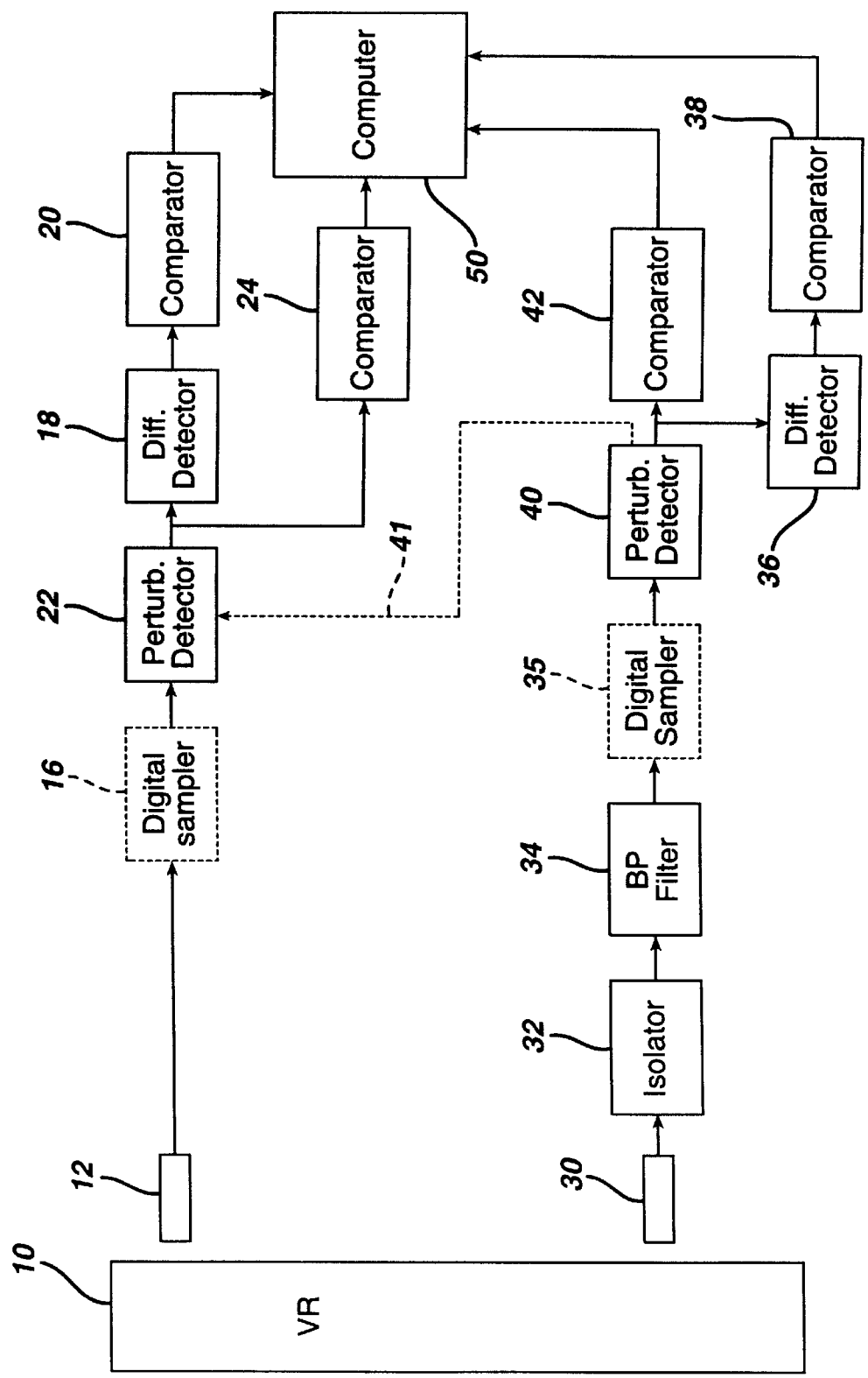
FIG. 1 is a schematic block diagram of a preferred embodiment of the present invention.

Referring now to FIG. 1, there is shown a preferred embodiment for implementing the present invention for monitoring a voltage regulator 10 which include therein, one or more electrodes and a plurality of shelves with contact surfaces. The invention includes a RF sensor 12 for sensing RF signals. The RF sensor 12 may be implemented in variety of different configurations. By way of example, but not by way of limitation, the RF sensor 12 may be implemented by means of a high frequency current transformer on the ground strap to a coupling capacitor placed on one terminal of the voltage regulator 10. Alternatively, the RF sensor 12 may be implemented by means of an impedance (resistive or inductive) in series with a coupling capacitor connected to the high voltage lead. For this configuration, the RF signals of interest are obtained across the impedance. Alternatively, similar RF information can be obtained using a clamp-on high frequency CT (current transformer) on the ground-strap of the transformer tank. In this configuration, the signal on the ground strap is picked up by a radio frequency current transformer (RFCT) through which is connected a ground strap to a coupling capacitor of the sensor 12. See FIG. 3. For example, the bandwidth of this sensor 12, when configured with an RF transformer arrangement is approximately 100 MHz with a 3 dB roll-off at about 500 kHz. This sensor-RFCT arrangement is an inexpensive, safe, sensitive method for detecting electrical discharge events ranging from large arcing events down to much smaller partial discharge events.

The next step in the method or system is to provide signal analysis. In a preferred embodiment, the signal from the sensor 12 may optionally be applied to a digital sampling device 16 which samples at a particular desired frequency rate. If a digital sampler is used, then typically the sampling frequency will be twice the value of the highest frequency of interest in the signal from the element 14. An anti-aliasing filter may be included as part of the digital sampling device 16 to prevent high frequency fold-over into the signal of interest. However, it should be noted that the present invention is not limited to the use of digital sampling, and may be conveniently be configured without a sampler to thereby analyze analog signals.

If RF sensing is used without vibration sensing, then some method of processing is necessary in order to determine when break contact events and make contact events have occurred between the electrode and the shelves. By way of example, one method of such processing is to apply the signal either directly, if a digital sampling device 16 is used, from the device 16 to a perturbation detector 22 for detecting perturbations in the signal. By way of example, this detector 22 may comprise an amplitude detector which is set to detect amplitude signal peaks above a predetermined threshold. Alternatively, this perturbation detector 22 may comprise a peak counter device for counting the number of pulses within a predetermined time interval. Alternatively, this perturbation detector 22 may comprise an integrator for integrating either the positive or the negative portion of the waveform over a predetermined period of time in order to obtain an indication of average energy for that segment of time. A perturbation detected by the perturbation detector 22 may then be applied to a comparator 20 to compare the signal against a pre-determined reference or against a database of perturbation signatures. In one embodiment, the time period between a break contact event of an electrode with a shelf and a make contact event for that electrode with a second shelf may be determined in a difference detector or counter 18, and that time interval may then be compared in a comparator 20 with a predetermined time period determined for that particular electrode or for a standard electrode when the electrode and the shelf are new, or after some predetermined level of normal electrode and shelf wear. If the comparator 20 shows a significant change in the time interval between the break contact event and the make contact event, then an indication of wear or another characteristic may be determined from the value of that change.

Alternatively, or in addition, a comparator 24 may be provided to compare a parameter of the signal, such as the amplitude parameter or the average energy parameter or the number of pulses in the signal during the break contact event or the make contact event, to a predetermined reference value or a database of values. If the signal parameter is different by a predetermined threshold amount from the reference value or alternatively, if the parameter substantially matches a predetermined reference value, then a particular wear or other characteristic may be ascribed to that electrode or shelf or the combination thereof.

It should be noted that the difference determinator 18 may include a pulse counter for counting the number of clock pulses occurring between the break contact event and the make contact event in order to determine the time therebetween. By way of example, this pulse counter may be comprised of a Hewlett Packard 5302A 50 MHz universal counter.

In a preferred aspect of the present invention, vibration is also measured for the voltage regulator, and this vibration signal is used in conjunction with the RF signal in order to determine characteristics of the electrode and shelves. The vibration sensing may be accomplished using a variety of different techniques well known to those of ordinary skill in the art. By way of example, but not by way of limitation, the vibration measurement may be performed using a sensor 30 comprising a magnetically-mounted FET type accelerometer, which is sensitive to radial motion, and which is contacted to the side of the voltage regulator case. In one embodiment of the present invention, placement of the accelerometer was approximately at the level of the electrode and shelf switching mechanism and between two of a plurality of heat convector units. The accelerometer 30 typically includes a dc power supply such as a battery. With this type of configuration, an isolator interface box 32 is used to excite the accelerometer 30, remove the dc component, and to couple to further signal processing elements. It should be noted that the isolator box 32 is an optional element and its use depends on the type of accelerometer utilized.

The vibration signal from block 32 is then applied to a bandpass filter 34. The band pass filter 34 operates to pass a predetermined band of frequencies. By way of example, the passband could be approximately 400 Hz to 15 KHz, to thereby eliminate the background and other extraneous noise below 400 Hz.

In a preferred embodiment, the vibration signal is then applied to a digital sampling device 35. Note, however, that this digital sampling is not necessary in order to implement the present invention.

Following the bandpass filter 34, or in the case of the preferred embodiment from the digital sampling device 35, the vibration signal may be applied to a perturbation detector 40. The perturbation detector 40 may be used to detect amplitude signals or peak-to-peak signals that exceed a predetermined threshold, or may be used to detect a number of peaks within a time interval that differs from a predetermined threshold level, or may be used to detect an average energy within a predetermined time interval by integrating the area in either the positive portion or the negative portion of the waveform that differs from a predetermined threshold to thereby determine a break contact event and/or a make contact event.

In one embodiment, the time difference between perturbations may then be measured by means of a clock pulse counter 36 counting the number of clock pulses between the events or by some other convenient time difference measurement element, and that time difference may be compared in a comparator 38 to a reference time difference or to the time differences in a database in order to determine a particular characteristic of the electrode and/or shelf.

Alternatively, or in addition, the signal from the perturbation detector 40 may be applied to a comparator 42 wherein the amplitude, or the number of peaks in a predetermined time interval, or the average energy in that time interval is compared to a reference value or values for that parameter in order to determine a particular characteristic of the electrode and/or shelves.

In a preferred embodiment, these comparisons from the comparators 20, 24, 38, and 42 may be applied to a computer 50 programmed to correlate one or more items of this data with reference information in order to make a determination of a characteristic of the electrode and shelves.

In a preferred embodiment, the perturbation detection may be performed only on the vibration signals, and the time of occurrence of these perturbation events in the vibration signal may be used to sample or capture a segment of the RF signal in a time period that includes this perturbation time for the vibration signal. In essence, the perturbation in the vibration signal is being correlated with the simultaneously recorded time period in the RF signal. Various parameters of the RF signal may then be compared to reference levels for those particular parameters in order to determine a particular characteristic such as wear for the electrode and/or shelves. Accordingly, where the time of occurrence of the perturbation for the vibration signal is used to determine which section of the RF signal to analyze, then a perturbation detection operation in the detector 22 is reduced to receiving a sampling or segment capture control signal on line 41 from the perturbation detector 40 and then selecting those particular samples or where sampling is not used, capturing that particular segment for analysis and or comparison. By way of example, the sampling window triggered by the perturbation time detection in the vibration signal may begin 2 milliseconds in advance of the time of the vibration signal perturbation and proceed for 50 milliseconds beyond the time of perturbation of the vibration signal.

Figure 2A:
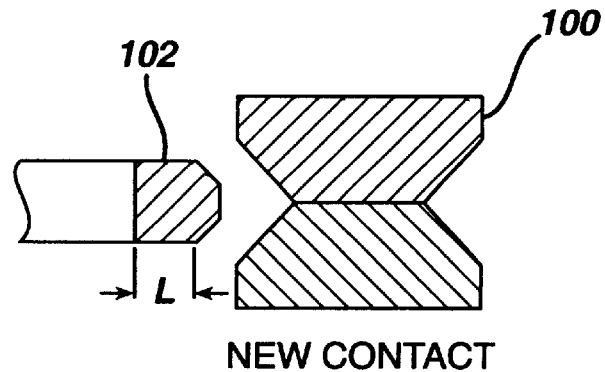
FIGS. 2A–C show side views of a new electrode and shelf, a electrode and shelf with normal contact wear, and a electrode and shelf at the end of contact life.
Figure 2B:
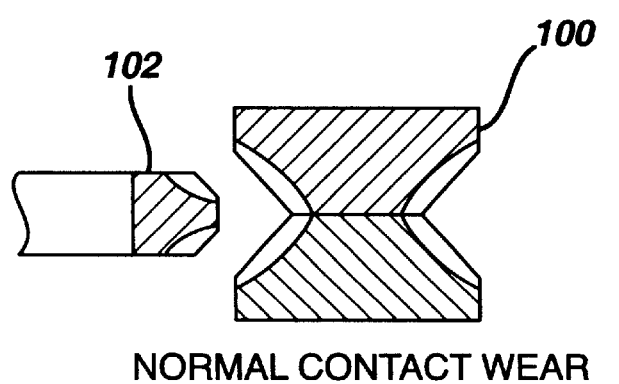
Figure 2C:
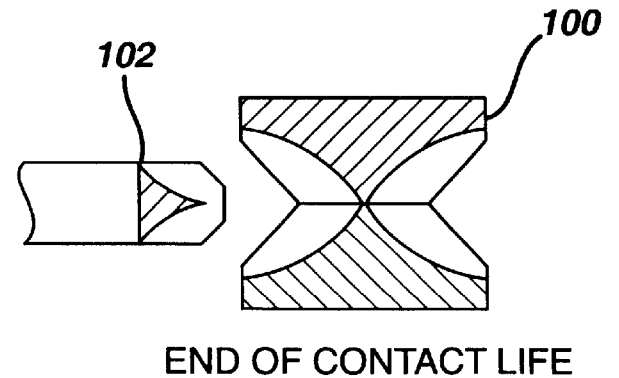

FIG. 2A illustrates a side view of a shelf 100 and a electrode 102 where both the electrode and the shelves are new. FIG. 2B illustrates the shelf 100 and the electrode 102 after normal contact wear. FIG. 2C illustrates the shelf 100 and the electrode 102 at the end of contact life.

Figure 3:
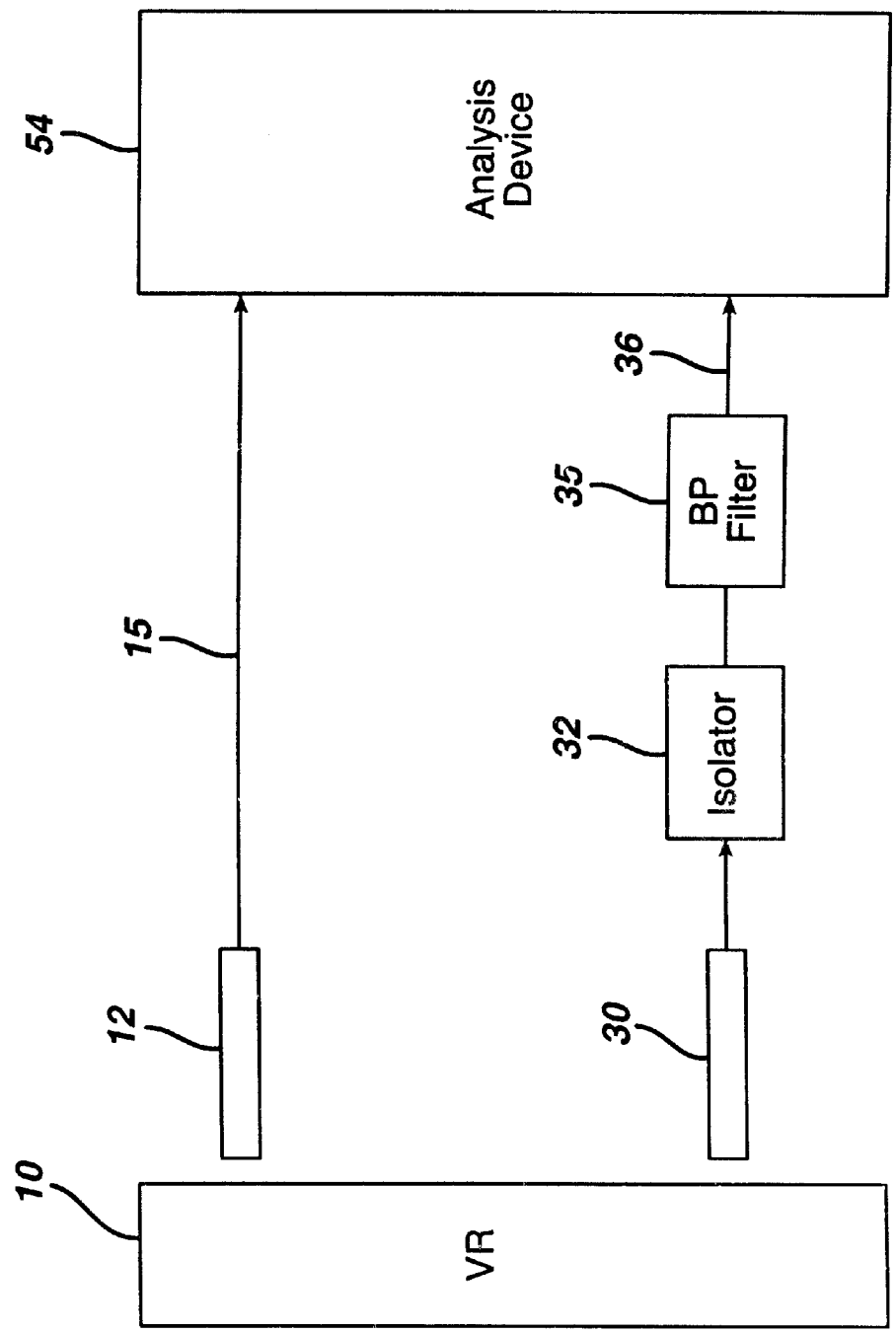
FIG. 3 is a schematic block diagram of another embodiment of the present invention.

Referring now to FIG. 3, there is shown an alternate embodiment of the present invention. In this figure, the voltage regulator 10, the sensors 12 and 30, and the element 32 are the same as in FIG. 1. However, the RF signal on line 15 and the vibration signal on line 33 are applied to a analysis device 54. In one embodiment of this invention, the utilization block 54 may be comprised simply of a high speed digital sampling oscilloscope. By way of example, an 8-bit 2 channel Yokogowa high speed digital sampling oscilloscope may be used which is set to 10 million samples per second, recording data for approximately 100 milliseconds after initiation of a switching event. By recording the RF signal from line 15 and the vibration signal on line 36, in time synchronization, (which may be displayed one above the other), wear and other characteristics of the electrode and/or the shelves may be determined visually or by other convenient means.

Alternatively, the utilization block 54 may be simply comprised of a computer which may be programmed to perform a variety of different functions including digital sampling of the RF signal and the vibration signal, the perturbation detection for each of these signals, and the comparison of the detected perturbations to one or more reference levels. Additionally, the time interval between break contact events and make contact events may be determined and compared to reference time intervals as described previously. Note that the perturbation detection need only be detected for the vibration signal, if desired, as described above, and that detection used to select the samples of the RF signal for analysis.

A variety of tests were run using a configuration of the present invention. Tests were initially run at no voltage on the voltage regulator 10 repeating electrode changes from 8L–7L and back a plurality of times. Then a rated voltage of approximately 17kV was placed on the test voltage regulator 10 by stepping up from a 460 volt supply using a second, identical voltage regulator and repeating the tests. Both the RF and vibration signals were recorded over an electrode-change range from 14 to 16 and back, and repeated twice, both with and without voltage, as well as at lower voltage (100V), and in a short circuit test with a load current of 588 Amps. Finally, an artificially degraded set of contacts and a shelf were introduced into the voltage regulator 10 at positions 14 and 15, and the cycle of testing repeated from shelves 16 to 10 and back to 16, after a short period of running in. The tap-range was then extended down to 10 and back, both with and without 17 kV voltage on the voltage regulator 10.

In the figures to be discussed below, the upper trace 120 is the RF signal and the lower trace 130 is the vibration signal. In the vibration signal, the two sets of major oscillations are from an electrode moving off of a first shelf, and then that same electrode moving up on and hitting the next shelf. The transit time for this movement can be determined from these charts, and is approximately 28–30 milliseconds.

It was determined that a micro-switch used in most voltage regulators in order to count the number of tap change events that the voltage regulator has undergone in order to trigger a predetermined maintenance cycle will cause a particular arcing signature. This arcing signature and other extraneous arcing signatures may be identified and discounted in the signal analysis. It should also be noted that some variation in the RF signal intensity are caused by the timing of the electrode movement between the make and break events relative to the voltage cycle of the voltage regulator 10, especially when near the zero-crossing.

It should also be noted that certain pre-contact arc events may be detected prior to the vibration signal indication that an electrode has made contact with a shelf. This pre-contact arc event may be an arc jumping the gap between the shelf and the electrode contact, or due to a slight "hopping" of the electrode across the shelf, before sliding off the shelf. Such pre-contact arc events may be analyzed against predetermined thresholds or relative to a library of arc signatures in order to determine one or more characteristics of the electrode and/or shelves.

Referring now to the test results, FIG. 4A illustrates a graphical representation of a RF signal 120 and a simultaneously sensed vibration signal 130 recorded directly therebelow in time synchronization. The group of peaks 132 in the vibration signal 130 represent a break contact event of an electrode with the surface of a first shelf. The second group of peaks 134 in the vibration signal 130 represents a make contact event between the same electrode and a second different shelf. Note that this test is for a new electrode and a new shelf at high voltage and no load. The RF signal 120 includes a pre-contact arc event signature 122, and further include a group of peaks 124 that coincide with the group of peaks 132 in the vibration signal. The RF signal 120 further includes an RF signature 126 caused by the previously described micro-switch, which signature can be discounted by means of the vibration signal. It can be seen from this figure that there is minimal RF activity corresponding to the time period of the second group of pulses 134 in the vibration signal 130. Note that this test was for a movement of the electrode from shelf 14 to shelf 15 in a voltage raising operation.

FIG. 4B shows a graphical representation of a RF signal 120 and a simultaneously recorded vibration signal 130 for a bad electrode on a bad shelf at high voltage and no load. It can be seen that the micro switch signature 126 is again present. The peak activity 132 in the vibration signal 130 is present for the break electrode contact event, as is the peak activity 134 for the make contact event. Likewise, the peak activity 124 in the RF signal 120 is present. However, it can be seen that there is a significant difference in the time interval between the peak activity 132 and the peak activity 134 of 30 milliseconds in FIG. 4A and 50 milliseconds in FIG. 4B, which is indicative of a bad electrode contact and/or shelves. Additionally, the vibration signatures 132 and 134 for the break contact event and the make contact event, respectively, are noticeably less for the bad electrode contact and shelf contacts relative to the good electrode contacts and shelf contacts shown in FIG. 4A.

Figure 4C:
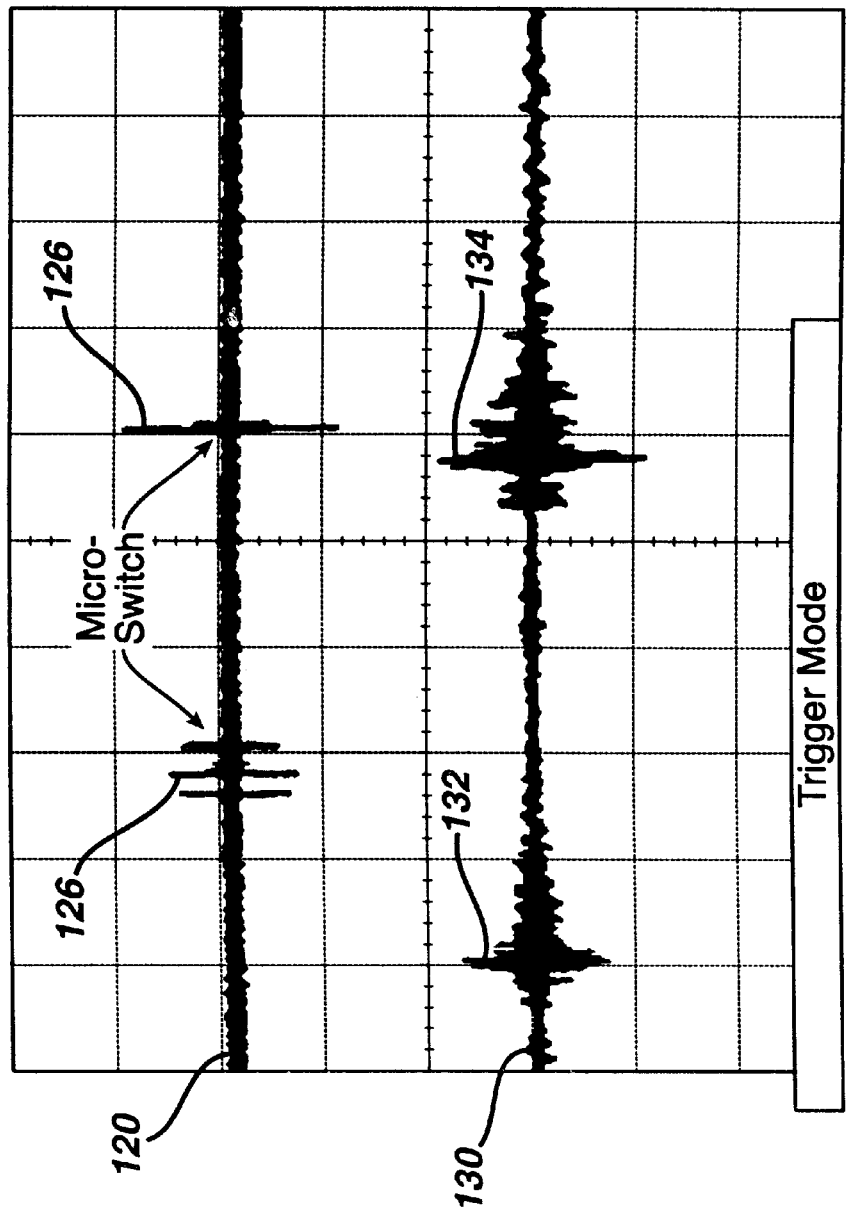
FIG. 4C is a graphical representation of an RF signal with a simultaneously sensed vibration signal for tap change events with bad electrode contacts and bad shelves under no voltage and no load.

Referring now to FIG. 4C, the same test was run for an electrode movement from shelf 14 to shelf 15 for a raising voltage situation for a bad electrode contact and bad shelf contact but at no voltage and no load. Approximately the same information is provided as shown in FIG. 4B. However, there is not an RF peak grouping corresponding to the time interval of the break contact event peak grouping 132 or an RF peak grouping corresponding to the make contact event peak grouping 134 in the vibration signal 130.

Note that no pre-arc signature 122 is shown in FIG. 4B and FIG. 4C. This may be used as an indication of a particular characteristic of the electrode contact and the shelf contacts.

Figure 5A:
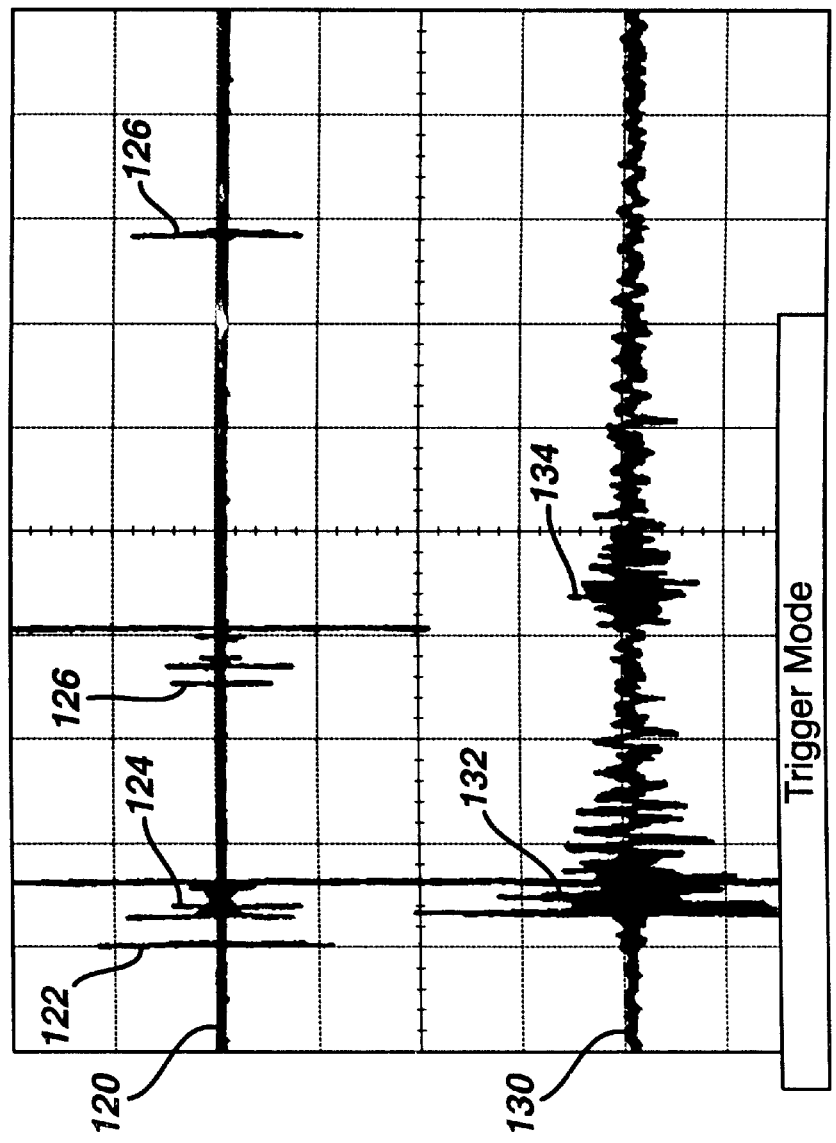
FIG. 5A is a graphical representation of an RF signal with a simultaneously sensed vibration signal for good electrode contacts on good shelves at high voltage and no load.

Referring now to FIG. 5A, an RF signal 120 and a simultaneously recorded vibration signal 130 for a movement of an electrode from the number 7 shelf to the number 8 shelf in a lowering voltage situation for a good electrode and good shelves at high voltage and no load is shown. The peak grouping 132 for the break contact event and the peak grouping 134 for the make contact event are shown for the vibration signal 130. Likewise, for the RF signal 120 a pre-arc event signature 122 is shown, as well as an RF peak grouping signature 124 coinciding with the time for the peak grouping 132 in the vibration signal 130. Also shown is are signatures 126 for the micro switch.

Figure 5B:
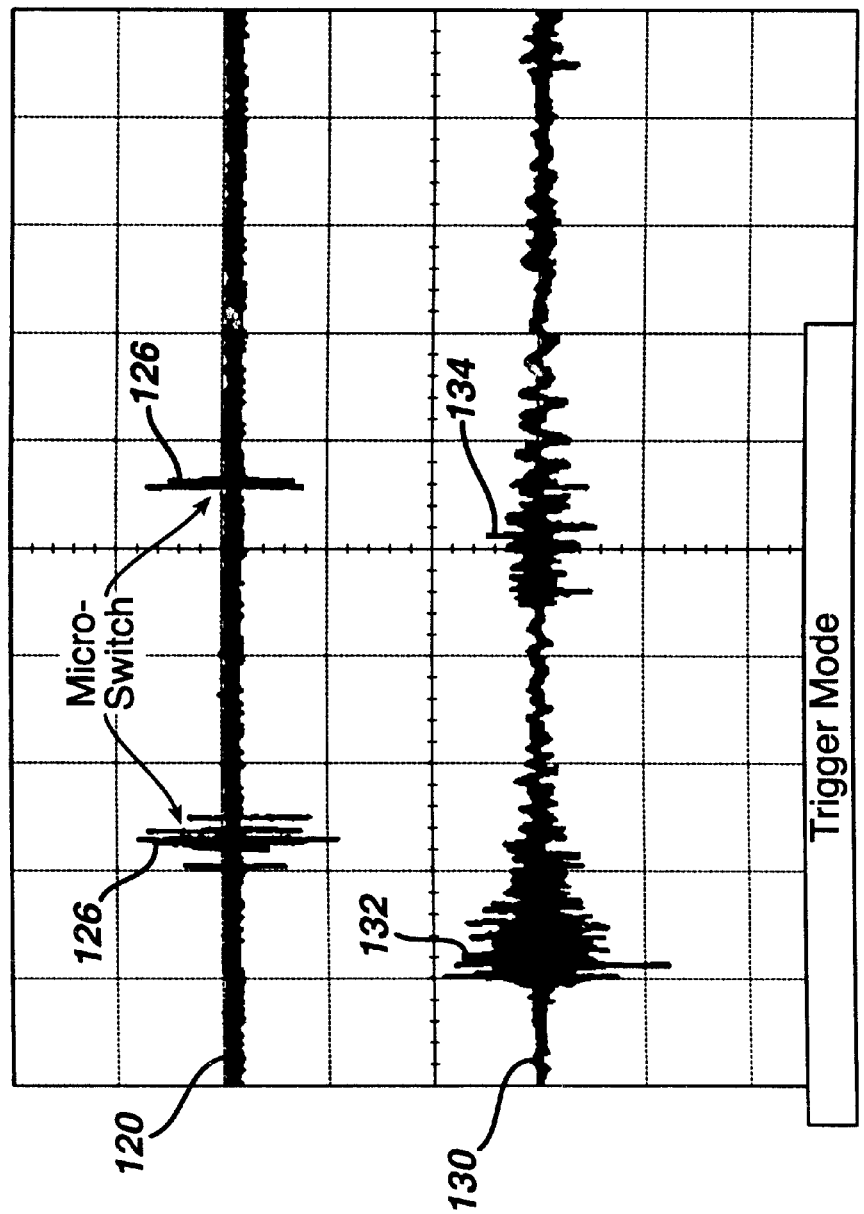
FIG. 5B is a graphical representation of an RF signal with a vibration signal for tap change events with bad electrode contacts on good shelves at no voltage and no load.

FIG. 5B shows an RF signal 120 and a simultaneously recorded vibration signal 130 for an electrode movement from shelf 10 to shelf 11 in a raising voltage situation for a bad electrode contact onto a good shelf contact at no voltage and no load. The vibration signal 130 includes a peak grouping 132 for the break contact event and a peak grouping 134 for the make contact event to a different shelf. Likewise, the RF signal 120 includes a signature 126 for the micro-switch, but does not include any other RF signatures. Moreover, the RF signal does not include any peak grouping signature corresponding in time to the peak groupings 132 or 134 in the vibration signal. This is a significant change which may be utilized to indicate a wear characteristic and other characteristics on the electrode and/or shelves.

Figure 5C:
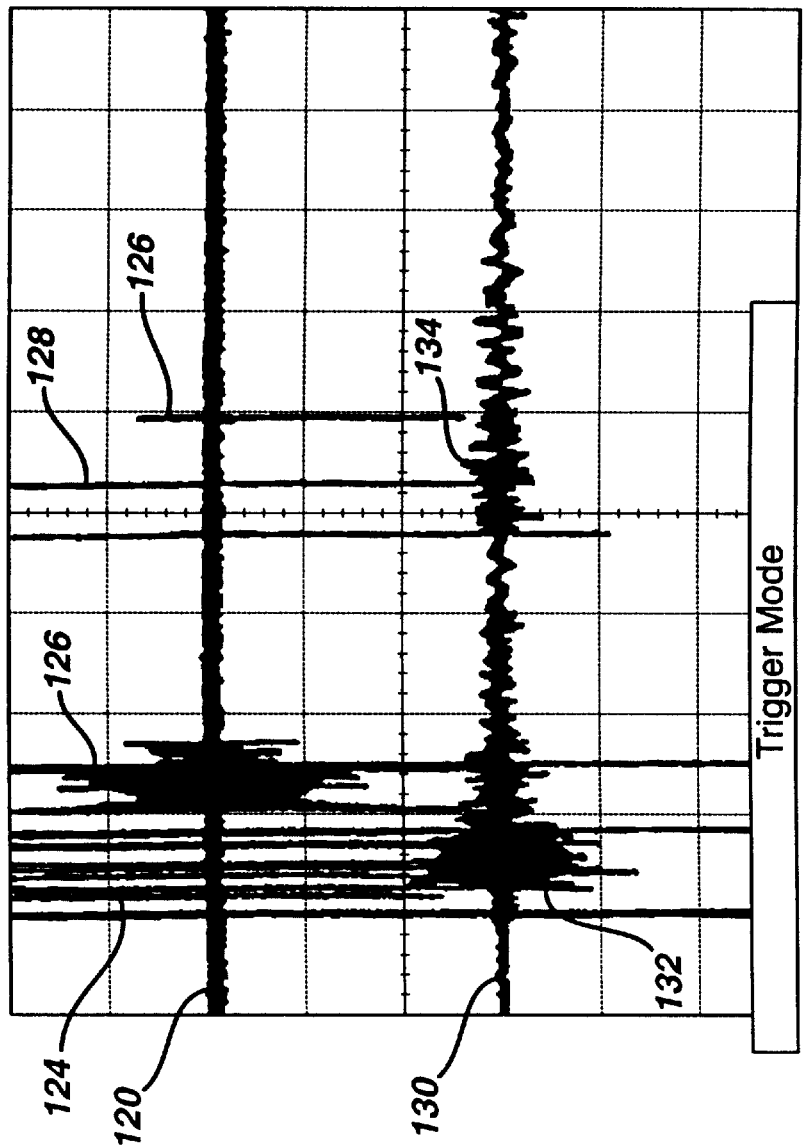
FIG. 5C is a graphical representation of an RF signal with a simultaneously sensed vibration signal for tap change events with a bad electrode contact on good shelves at high voltage and no load.

Referring now to FIG. 5C, there is shown an RF signal 120 and a simultaneously recorded vibration signal 130 for a bad electrode contacting good shelves in a movement from shelf 10 to shelf 11 in a raising voltage situation at high voltage and no load. The peak grouping 132 for a break contact event and a peak grouping 134 for a make contact event in the vibration signal 130 is shown. Likewise, for the RF signal a micro switch signature 126 is shown, as well as very large peak to peak pulses coinciding in time with the peak groupings 132 and 134 in the vibration signal 130. These pulse signatures, individually or in combination, may be utilized to diagnose a bad electrode contact.

It should be noted that comparable results are obtained when the movement between shelves is reversed.

In view of the above, it can be seen that in some limited situations the peak-to-peak voltage and the pulse count indicating delay between pulse groupings for either of the RF signal or the vibration signal are not sufficiently discriminating, while in other situations they provide precise diagnoses of the characteristic of interest. However, it can be seen that in almost all instances an analysis of a combination of these various pulse signatures from the RF signal and from the vibration signal may be utilized in order to provide an accurate diagnosis of one or more characteristics of the electrodes and/or shelves or other aspects in the voltage regulator. If only the RF signal is analyzed, then it is preferred that the integrated area of the signal be analyzed relative to reference levels in order to obtain a characteristic of the electrodes or the shelves. Preferably, this integration should take place after the signature (126) from the micro-switch is removed.

It can be seen from the foregoing that the above described analysis of one or more of the RF signal and the vibration signal may be used to provide an accurate diagnosis for electrode-shelf wear on operational units in the field, as well as the electrode-shelf remaining life. This diagnosis and remaining life characteristic could be enhanced with the use of historical data on that particular electrode-shelf configuration. In a further configuration of the invention, a database of signatures for the RF signal and for the vibration signal for voltage regulators of varying age and wear could be recorded and a transfer function generated based on measurements from a variety of different units.

The present invention may also be used to diagnose coking, found on the reversing switch, the taps or the shelves. RF signatures correlating with coking could be determined and used in the comparator or in the computer embodiment.

It should be noted that the RF activity in the RF signal during switching events depends to some extent upon where in the voltage cycle the electrode change occurs. In order to improve diagnosis, the signal received over several electrode changes between shelves may be averaged, or the voltage level may be monitored and the RF signal may be scaled with the voltage across the path at the time of the arcing events in the RF signal.

As an alternative to the sensor 30 for the vibration signal, a magnetically mounted acoustic sensor that responds to higher frequencies may be utilized. By way of example, a UE Systems contact probe that monitors in the 10 kHz to 100 kHz regime may be utilized. These sensors may be tuned to detect vibration peak groups while being isolated from mechanical signals, as it is known that arcing in air has a strong resonance in the 25 kHz to 45 kHz regime.

It can be seen from the above that pulse grouping signatures in vibration signals and RF signals may be correlated with an electrode starting to move from a shelf, moving off the shelf, as well as the electrode approaching a second shelf and contacting that second shelf. The time-delay of these events also correlate with the degree of erosion and wear on the electrode and/or shelves. Likewise, changes in the integrated amount of RF signal and the vibration signal correlate with conditions of the electrode and shelf surfaces. It is particularly advantageous to use both the RF and the vibration signature data together to allow for improved identification and diagnosis of wear and other characteristics in the voltage regulator. The use of both signals together improves confidence in the interpretation of the data, as well as facilitates diagnosing problems related to electrical discharge activity such as "coking" of the electrodes, particularly in the reversing switch which operates only infrequently as compared to the tap changers.

It is particularly advantageous to convert the RF signal and the vibration signal into digital form, to thereby allow a variety of other parameters of the signatures to be analyzed and correlated with events occurring within the voltage regulator. Such parameters might include the duration of the vibration ringing, or the amount of RF activity after the electrode begins moving but before it leaves the first shelf, rather than merely analyzing the gross activity over the entire cycle of the movement. Similarly valuable information is contained in the RF activity as the electrode approaches the second shelf when there are pre-strikes of small arcs. The duration of these arc events is related to the shape (and hence wear) of the electrodes.

It should be noted that although the present invention was disclosed in the context of voltage regulators, it has wide application for diagnosing wear and other characteristics in motors, generators and other high voltage equipment where RF and vibration signatures are generated that change over the life and condition of the equipment.

The foregoing description of a preferred embodiment of the invention has been presented for purposes of illustration and description. It is not intended to be exhaustive or to limit the invention to the precise form disclosed, and modifications and variations are possible in light of the above teachings, or may be acquired from practice of the invention. The embodiment was chosen and described in order to explain the principles of the invention and its practical application to enable one skilled in the art to utilize the invention in various embodiments and with various modifications as are suited to the particular use contemplated. It is intended that the scope of the invention be defined by the claims appended hereto, and their equivalents.

We claim:

1. A diagnostic method for determining a characteristic of electrode contacts and/or contacted surfaces comprising the steps of:
    sensing, during a movement that causes an electrode to have a break contact event with a first contacted surface and to have a make contact event with a second contacted surface, an RF signal from at least one electrical discharge event during said movement; and
    using a parameter of said RF signal to diagnose said characteristic of said electrode contact and/or contacted surfaces, wherein said using step comprises the step of determining at least one of:
    RF activity using said break contact and make contact events and determining a delay between said break contact event and said make contact event;
    an amplitude of said RF signal during at least one of said break contact event and make contact event; and
    an integral of a portion of said RF signal, wherein the portion of said RF signal is integrated by a perturbation detector.

2. A diagnostic method as defined in claim 1, wherein said using step comprises displaying a waveform representing aspects of said RF signal.

3. A diagnostic method as defined in claim 1, wherein said using step comprises recording a waveform representing aspects of said RF signal.

4. A diagnostic method as defined in claim 1, wherein said using step comprises digitally sampling said RF signal.

5. A diagnostic method as defined in claim 1, wherein said using step further comprises comparing said determined delay with a reference delay.

6. A diagnostic method as defined in claim 1, wherein said using step further comprises the step of comparing said amplitude to a reference amplitude.

7. A diagnostic method as defined in claim 1, wherein said delay determining step comprises the step of counting clock pulses occurring between said break contact event and said make contact event.

8. A diagnostic method as defined in claim 1, further comprising the step of sensing, simultaneously with said RF signal sensing step, a vibration signal generated by at least one of said break contact event and said make contact event; and
    using a parameter of said vibration signal to assist in diagnosing said characteristic.

9. A diagnostic method as defined in claim 8, wherein said vibration signal parameter using step comprises the step of digitally sampling said vibration signal.

10. A diagnostic method as defined in claim 8, wherein said parameter using steps comprise the steps of:
    determining a first time when a level of activity in said vibration signal exceeds a predetermined threshold level of activity; and
    monitoring a parameter of said RF signal in a time period that includes said first time.

11. A diagnostic method as defined in claim 8, wherein said parameter using steps comprise the steps of;
    determining a first time and a second time when a level of activity in said vibration signal exceeds a predetermined level of activity; and
    monitoring a parameter of said RF signal in a time period that includes said first and second times.

12. A diagnostic method as defined in claim 11, wherein said activity in said vibration signal comprises a vibration signal amplitude.

13. A diagnosing method as defined in claim 11, wherein said activity in said vibration signal comprises a peak grouping above a predetermined threshold.

14. A diagnosing method as defined in claim 11, wherein said activity in said vibration signal comprises an integrated signal magnitude in a predetermined time interval.

15. A diagnostic method as defined in claim 11, wherein said RF signal monitoring step comprises the step of monitoring the amplitude of said RF signal.

16. A diagnostic method as defined in claim 11, wherein said RF signal monitoring step comprises the step of monitoring the peak groupings of said RF signal.

17. A diagnostic method as defined in claim 11, wherein said RF signal monitoring step comprises the step of monitoring the integrated signal magnitude in a predetermined time interval of said RF signal.

18. A diagnostic method as defined in claim 11, wherein said u sing step includes the step of digitally sampling said RF signal.

19. A diagnostic method as defined in claim 11, wherein said using step comprises the step of determining at least two instances of RF activity above a predetermined threshold activity level and determining a time delay between said two instances.

20. A diagnostic method as defined in claim 19,
    further comprising the step of comparing said time delay to a reference value; and
    generating a signal if said time delay exceeds said reference value.

21. A diagnostic method as defined in claim 8, further comprising
    sending said RF signal and said vibration signal to a computing device;
    determining a first time and a second time when a level of activity in said vibration signal exceeds a predetermined level of activity; and
    measuring parameters in each of said RF signal and said vibration signal that occur during a time period that includes said first and second times; and
    determining said characteristic based on at least one of said measured parameters.

22. A diagnostic method as defined in claim 11, wherein said using step comprises the step of recording waveforms representing aspects of said RF signal and said simultaneously sensed vibration signal one above the other in time synchronization.

23. A diagnostic method for determining a characteristic of electrode contacts and/or contacted surfaces in a voltage regulator comprising the steps of sensing a vibration signal from said voltage regulator;

sensing simultaneously an RF signal from said voltage regulator;

determining at least a first time when a level of activity in said vibration signal exceeds a predetermined threshold level of activity;

measuring a first parameter of said RF signal occurring in a time period that includes said first time, measuring a second parameter of said vibration signal occurring in said time period; and determining said characteristic based on at least one of said first and second parameters.

24. A diagnostic method as defined in claim 23, wherein said RF signal and said vibration signal are digitally sampled and wherein said parameters are measured from said digitally sampled signals.

25. A diagnostic method as defined in claim 23, further comprising the step of determining a second time when said level of activity in said vibration signal exceeds said predetermined threshold level of activity;

measuring said first parameter of said RF signal and said second parameter of said vibration signal in said time period, wherein said time period includes said first and said second times.

26. A diagnostic method as defined in claim 25, wherein first parameter of said RF signal is measured substantially only around said first and second times.

27. A diagnostic method as defined in claim 25, wherein at least one of said first and second parameters is a delay measurement between said first and second times; and wherein said delay measurement parameter is compared to a reference value.

28. A diagnostic method as defined in claim 25, wherein at least one of said first and second parameters is a signal amplitude; and wherein said amplitude is compared to a reference value.

29. A diagnostic method as defined in claim 25, wherein at least one of said first and second parameters is an indication of energy; and wherein said energy is compared to a threshold value.

30. A diagnostic method as defined in claim 25, wherein said determining step comprises recording waveforms representing aspects of said RF signal and said simultaneously sensed vibration signal one above the other in time synchronization.

31. A diagnostic method as defined in claim 25, wherein said RF signal and said vibration signal are sent to a computing device to determine said characteristic based on at least one of said first and said second parameters.

32. A diagnostic system for determining a characteristic of electrode contacts and/or contacted surfaces, comprising:

an RF sensor for sensing RF from partial electrical discharge events;

a vibration sensor for sensing vibration from movement that causes an electrode to have a break contact event or a make contact event;

a circuit for determining a first time and a second time when a level of activity in said vibration signal exceeds a predetermined threshold level of activity; and a recorder for recording said RF signal and said vibration signal occurring in a time period that includes said first time and said second time.

33. A system as defined in claim 32, further comprising a circuit for determining a parameter of one of said RF signal and said vibration signal and comparing that parameter to a predetermined threshold.

* * * * *